US012562333B2

(12) United States Patent
Wong et al.

(10) Patent No.: US 12,562,333 B2
(45) Date of Patent: Feb. 24, 2026

(54) METHOD AND APPARATUS FOR NON-INVASIVE, NON-INTRUSIVE, AND UN-GROUNDED, SIMULTANEOUS CORONA DEPOSITION AND SHG MEASUREMENTS

(71) Applicant: FemtoMetrix, Inc., Los Angeles, CA (US)

(72) Inventors: Timothy M. Wong, Los Angeles, CA (US); William H. Howland, Wexford, PA (US)

(73) Assignee: FEMTOMETRIX, INC., Los Angeles, CA (US)

( * ) Notice: Subject to any disclaimer, the term of this patent is extended or adjusted under 35 U.S.C. 154(b) by 0 days.

(21) Appl. No.: 18/350,249

(22) Filed: Jul. 11, 2023

(65) Prior Publication Data

US 2024/0085470 A1     Mar. 14, 2024

Related U.S. Application Data

(60) Provisional application No. 63/400,323, filed on Aug. 23, 2022, provisional application No. 63/400,330, (Continued)

(51) Int. Cl.
*G01R 31/26* (2020.01)
*G01R 31/265* (2006.01)
(Continued)

(52) U.S. Cl.
CPC ........ *H01J 37/026* (2013.01); *G01R 31/2601* (2013.01); *G01R 31/2656* (2013.01); (Continued)

(58) Field of Classification Search
CPC ...... H01J 37/026; H01J 37/226; H01J 37/244; H01J 37/28; H01J 2237/0048; (Continued)

(56) References Cited

U.S. PATENT DOCUMENTS 3,218,498 A * 11/1965 Schroeder .............. G01N 21/67
                                                    313/146
4,584,531 A * 4/1986 Couch .................. G01N 27/626
                                                    324/464
(Continued)

FOREIGN PATENT DOCUMENTS

CA        2030878        5/1991
CN        1864066        11/2006
(Continued)

OTHER PUBLICATIONS

"Basis of Ion Implanter" edited by Beijing Municipal Radiation Center, Beijing Press, Sep. 1981, pp. 310-311.
(Continued)

*Primary Examiner* — Christopher P Mcandrew
(74) *Attorney, Agent, or Firm* — KNOBBE, MARTENS, OLSON & BEAR, LLP

(57) ABSTRACT

Apparatus is described for performing simultaneous corona deposition and surface electric field induced second harmonic (EFISH) measurements. Example designs include systems including corona guns having a focus tube for deposition of corona charge with windows therein for passage of a laser beam incident on and reflected from a sample surface. Various designs may also employ masks proximal the distal end of the focusing tube and/or proximal the sample surface. In some implementations, the apparatus is used to make ungrounded and therefore non-invasive measurements, for example, on dielectric on semiconductor such as, e.g., interface state density ($D_{it}$), flatband voltage ($V_{fb}$) and/or lifetime measurements.

13 Claims, 7 Drawing Sheets

Related U.S. Application Data filed on Aug. 23, 2022, provisional application No. 63/388,398, filed on Jul. 12, 2022.

(51) Int. Cl.

| | |
|---|---|
| *H01J 37/02* | (2006.01) |
| *H01J 37/22* | (2006.01) |
| *H01J 37/244* | (2006.01) |
| *H01J 37/28* | (2006.01) |

(52) U.S. Cl.

CPC .......... *H01J 37/226* (2013.01); *H01J 37/244* (2013.01); *H01J 37/28* (2013.01); *H01J 2237/0048* (2013.01)

(58) Field of Classification Search

CPC . H01L 22/12; G01R 31/2601; G01R 31/2656; G01R 31/311; G01R 31/2831; G01R 29/24; G01N 21/9501; G01N 21/636; G01N 21/67

USPC ........................................................ 324/501

See application file for complete search history.

(56) References Cited

U.S. PATENT DOCUMENTS

| | | | | |
|---|---|---|---|---|
| 4,812,756 | A * | 3/1989 | Curtis ................ | G01R 31/2831 250/492.2 |
| 5,294,289 | A | 3/1994 | Heinz et al. | |
| 5,767,693 | A | 6/1998 | Verkuil | |
| 6,011,404 | A * | 1/2000 | Ma ....................... | G01R 31/265 324/754.21 |
| 6,191,605 | B1 | 2/2001 | Miller et al. | |
| 6,771,092 | B1 | 8/2004 | Fung et al. | |
| 6,791,099 | B2 | 9/2004 | Some et al. | |
| 6,856,159 | B1 | 2/2005 | Tolk et al. | |
| 7,064,565 | B1 * | 6/2006 | Xu ....................... | G01R 31/129 324/762.05 |
| 7,230,443 | B1 * | 6/2007 | Fung .................. | G01R 31/2831 324/762.05 |
| 7,248,062 | B1 | 7/2007 | Samsavar et al. | |
| 9,109,498 | B2 | 8/2015 | Bradley et al. | |
| 10,274,310 | B2 | 4/2019 | Hunt et al. | |
| 10,551,325 | B2 | 2/2020 | Koldiaev et al. | |
| 10,591,525 | B2 | 3/2020 | Koldiaev et al. | |
| 10,613,131 | B2 | 4/2020 | Koldiaev et al. | |
| 10,663,504 | B2 | 5/2020 | Koldiaev et al. | |
| 10,989,664 | B2 | 4/2021 | Adell et al. | |
| 11,150,287 | B2 | 10/2021 | Koldiaev et al. | |
| 11,199,507 | B2 | 12/2021 | Koldiaev et al. | |
| 11,293,965 | B2 | 4/2022 | Koldiaev et al. | |
| 11,415,617 | B2 | 8/2022 | Koldiaev et al. | |
| 11,473,903 | B2 | 10/2022 | Hunt et al. | |
| 11,808,706 | B2 | 11/2023 | Adell et al. | |
| 11,821,911 | B2 | 11/2023 | Koldiaev et al. | |
| 11,946,863 | B2 | 4/2024 | Lei | |
| 11,988,611 | B2 | 5/2024 | Koldiaev et al. | |
| 12,158,492 | B2 | 12/2024 | Lei | |
| 12,241,924 | B2 | 3/2025 | Koldiaev et al. | |
| 2002/0132378 | A1 * | 9/2002 | Abadeer ............ | G01R 31/2879 324/750.05 |
| 2003/0057972 | A1 | 3/2003 | Pfaff et al. | |
| 2004/0046539 | A1 | 3/2004 | Rhoads | |
| 2005/0051722 | A1 | 3/2005 | Makino et al. | |
| 2005/0083633 | A1 | 4/2005 | Riebel et al. | |
| 2006/0092500 | A1 | 5/2006 | Melloni et al. | |
| 2006/0267622 | A1 | 11/2006 | Lagowski et al. | |
| 2007/0069759 | A1 | 3/2007 | Rzepiela et al. | |
| 2010/0188094 | A1 * | 7/2010 | Allibert .............. | G01R 31/2648 324/501 |
| 2011/0031392 | A1 | 2/2011 | McEwen et al. | |
| 2012/0002696 | A1 | 1/2012 | Oki et al. | |
| 2013/0003070 | A1 | 1/2013 | Sezaki et al. | |
| 2013/0306866 | A1 | 11/2013 | Hoque et al. | |
| 2015/0002651 | A1 | 1/2015 | Shimizu et al. | |
| 2015/0014528 | A1 | 1/2015 | Lechner | |
| 2015/0122993 | A1 | 5/2015 | Noji et al. | |
| 2015/0330908 | A1 | 11/2015 | Koldiaev et al. | |
| 2015/0330909 | A1 | 11/2015 | Koldiaev et al. | |
| 2015/0331029 | A1 | 11/2015 | Koldiaev et al. | |
| 2015/0331036 | A1 | 11/2015 | Koldiaev et al. | |
| 2017/0338781 | A1 | 11/2017 | Lyalin et al. | |
| 2018/0033704 | A1 | 2/2018 | Suzuki et al. | |
| 2018/0038797 | A1 | 2/2018 | Eriguchi et al. | |
| 2018/0210026 | A1 | 7/2018 | Nikic et al. | |
| 2018/0292441 | A1 | 10/2018 | Koldiaev et al. | |
| 2019/0287760 | A1 | 9/2019 | He et al. | |
| 2020/0027693 | A1 | 1/2020 | Fang et al. | |
| 2020/0057104 | A1 | 2/2020 | Ma et al. | |
| 2022/0364850 | A1 | 11/2022 | Adler | |
| 2024/0071710 | A1 | 2/2024 | Wong | |
| 2024/0077302 | A1 | 3/2024 | Adler | |
| 2024/0085324 | A1 | 3/2024 | Shtykov et al. | |
| 2024/0085345 | A1 | 3/2024 | Wong | |
| 2024/0094278 | A1 | 3/2024 | Shtykov et al. | |
| 2025/0093277 | A1 | 3/2025 | Koldiaev et al. | |
| 2025/0155486 | A1 | 5/2025 | Koldiaev et al. | |
| 2025/0224327 | A1 | 7/2025 | James | |

FOREIGN PATENT DOCUMENTS

| | | | | |
|---|---|---|---|---|
| CN | 201837582 | 5/2011 | | |
| CN | 103441095 | 12/2013 | | |
| CN | 106415817 | 2/2017 | | |
| CN | 114678244 | 6/2022 | | |
| EP | 0 378 061 | 7/1990 | | |
| EP | 0 436 115 | 7/1991 | | |
| JP | 2016-178122 | 10/2016 | | |
| KR | 10-2007-0099902 | 10/2007 | | |
| KR | 10-2012-0071382 | 7/2012 | | |
| WO | WO 02/065108 | 8/2002 | | |
| WO | WO 2008/053518 | 5/2008 | | |
| WO | WO 2011/050264 | 4/2011 | | |
| WO | WO 2015/161136 | 10/2015 | | |
| WO | WO-2019210229 A1 * | 10/2019 | ............. | G01R 29/24 |

OTHER PUBLICATIONS

"Push-pull output", Wikipedia, accessed Aug. 22, 2025, in 6 pages. URL: https://en.wikipedia.org/wiki/Push%E2%80%93pull_output.

Adams, M.L.C., "Silicon surface passivation by thin films studied by corona charging", Eindhoven University of Technology, Master's Thesis, Mar. 2011, in 68 pages.

Aktsipetrov, O.A. et al., "dc-electric-field-induced second-harmonic generation in Si(111)-SiO$_2$—Cr metal-oxide-semiconductor structures", Physical Review B, Jul. 1996, vol. 54, pp. 1825-1832.

Fang, J. et al., "Detection of gate oxide charge trapping by second-harmonic generation", Applied Physics Letters, Nov. 1999, vol. 75, pp. 3506-3508.

Hu, C. C., *Modern Semiconductor Devices for Integrated Circuits*, Mar. 2009, 1st Edition, published by Pearson, 351 pages, ISBN-10: 8131730247, ISBN-13: 978-0136085256 (the NPL document submitted includes only the Title Overview and Table of Contents listing of this book).

Vanbel, M. K. et al., "Electric-Field-Induced Second-Harmonic Generation Demonstrates Different Interface Properties of Molecular Beam Epitaxy Grown MgO on Si", The Journal of Physical Chemistry, vol. 118(4), Jan. 2014, in 6 pages.

Vanbel, M. K. et al., "Tunneling of holes is observed by second-harmonic generation", Applied Physics Letters, vol. 102(8), Feb. 2013, in 5 pages.

Chinese Office Action and Search Report dated Feb. 28, 2024 in corresponding CN Application No. 201980043576.7.

Chinese Office Action and Search Report dated Oct. 24, 2024 in corresponding CN Application No. 201980043576.7.

Chinese Office Action dated Mar. 26, 2025 in corresponding CN Application No. 201980043576.7.

European Extended Search Report dated Jan. 20, 2022 in corresponding EP Application No. 19793928.3.

(56)  References Cited

OTHER PUBLICATIONS

International Search Report and Written Opinion dated Aug. 8, 2019 in corresponding PCT Application No. PCT/US2019/029439.
International Search Report and Written Opinion dated Oct. 30, 2023 in corresponding PCT Application No. PCT/US2023/069955.
International Search Report and Written Opinion dated Nov. 7, 2023 in corresponding PCT Application No. PCT/US2023/069948.
International Search Report and Written Opinion dated Oct. 27, 2023 in corresponding PCT Application No. PCT/US2023/069967.
Third-Party Submission dated May 30, 2022 in corresponding KR Application No. 10-2020-7034153.
Third-Party Submission dated Jun. 30, 2022 in corresponding KR Application No. 10-2020-7035967.
Taiwanese Office Action with Search Report dated Apr. 10, 2023 in corresponding TW Application No. 108124174.

* cited by examiner

METHOD AND APPARATUS FOR NON-INVASIVE, NON-INTRUSIVE, AND UN-GROUNDED, SIMULTANEOUS CORONA DEPOSITION AND SHG MEASUREMENTS

PRIORITY CLAIM

This application claims the priority benefit of U.S. Patent Prov. App. 63/388,398 entitled METHOD AND APPARATUS FOR NON-INVASIVE, NON-INTRUSIVE, AND UN-GROUNDED, SIMULTANEOUS CORONA DEPOSITION AND SHG MEASUREMENTS, filed Jul. 12, 2022; U.S. Patent Prov. App. 63/400,323, entitled METHOD AND APPARATUS FOR NON-INVASIVE, NON-INTRUSIVE, AND UN-GROUNDED, SIMULTANEOUS CORONA DEPOSITION AND SHG MEASUREMENTS, filed Aug. 23, 2022; and U.S. Patent Prov. App. 63/400,330, entitled METHOD AND APPARATUS FOR NON-INVASIVE SEMICONDUCTOR TECHNIQUE FOR MEASURING DIELECTRIC/SEMICONDUCTOR INTERFACE TRAP DENSITY USING SCANNING ELECTRON MICROSCOPE CHARGING, filed Aug. 23, 2022. Each of the above-noted applications is incorporated herein by reference in its entirety.

BACKGROUND

Technical Field

The present invention is in the technical field of semiconductor wafer testing, and more particularly, systems for charge deposition and surface electric field induced second harmonic measurement for wafer inspection, semiconductor metrology, materials characterization, surface characterization and/or interface analysis.

Description of the Related Art

The determination of electrical properties of a dielectric on a semiconductor wafer, the electrical properties of the interface between the dielectric and semiconductor and/or charge carrier lifetime within the semiconductor wafer can be useful for the production of these wafers. In order to determine such electrical properties, various measurement techniques may be employed, including the following: capacitance-voltage (CV), capacitive-time (Ct), corona-voltage-surface photovoltage (Q-V-SPV), conductance-voltage (GV) and/or charge carrier lifetime.

Such measurements may be obtained by performing CV measurements by applying voltage to a Metal Oxide Semiconductor (MOS) layer. As part of the measurement process, a MOS layer is formed by applying a metal directly to the dielectric material surface. However, the MOS layer formation process is tedious, time consuming and the wafer must be discarded following measurement.

Another difficulty with various measurement techniques stems from the need for the semiconductor wafer substrate to be grounded since voltages are either applied or measured. CV and Ct are already destructive since metal is applied to the front oxide surface, so grounding at the backside is not an issue. However, with Q-V-SPV methods, grounding takes place by penetrating the backside oxide with a sharp object. This process renders the measurement destructive and therefore, sacrificial with the wafer under test. Accordingly, testing production wafers causes damage to the backside. If the wafer is placed back into the Front Opening Unified Pod (FOUP) with other expensive product wafers, particles from the backside can contaminate neighboring wafers.

Moreover, many frontside non-contact measurements such as Q-V-SPV locate the underlying wafer chuck at a first position when corona charging the frontside of the wafer and a second wafer chuck position when testing the wafer using a Kelvin probe. During operation, the corona charging unit and the kelvin probe, occupy the same position in space relative to the measurement site at some point in time, and so the wafer chuck is moved to different locations when the charge deposition and subsequent measurements are performed. This process is time-consuming as the chuck moves the wafer back and forth. These moves can be rate limiting when attempting to make measurements in-line, on product wafers for Front End of Line (FEOL) process monitoring, especially with scanning or micro level Kelvin Probe systems that have expensive vibration control to assist with the positioning of probes within nanometers of the oxide surface. The wafer cannot be moved until the probe is retracted.

SUMMARY

Accordingly, various methods for measuring at least one electrical property of a semiconductor wafer comprises depositing corona charge on the top surface of an insulator layer to create a resultant semiconductor surface with an accumulated region, a depletion region, or a depletion region plus an inverted region.

Various methods might include an accumulated guard ring surrounding the depletion region, a deep depletion region or the depletion region and an inverted region.

Various methods may include electronics for measuring a response of the second harmonic generation of the frequency of the incident laser light (SHG), or more specifically, the Electric Field Induced Second Harmonic (EFISH) to the corona charge bias and SHG laser stimulus of the semiconductor wafer.

Various methods include determining from the response of the second harmonic generation (SHG) at least one electrical property of the object area of the semiconductor wafer.

In certain implementations, a depletion depth changing step may include the step of pulsing corona charge onto the semiconductor wafer above the existing steady state depletion region, resulting in a non-steady-state deeper depletion region relative to the steady state depletion region.

In certain implementations, a depletion depth changing step may include the step of pulsing the semiconductor wafer with above bandgap energy light, which momentarily decreases the depletion region depth.

Various designs and methods described herein includes configurations of the corona gun for allowing both corona charging and SHG measurement response at the measurement site without a wafer and wafer chuck move by reducing interference between corona charging and the SHG measurement.

In certain designs, the corona gun focus ring (see FIG. 1), provides a first window to allow the SHG laser light to enter the region of test and a second window to allow the SHG response to exit the measurement site and enter an optical detector.

In various implementations, the corona gun has a working distance of >10 mm. This working distance of greater than or equal to 10 mm allows the SHG laser interrogating light to pass under the corona gun mask, enter the measurement site, and the resultant SHG signal to pass outside of the measurement site to the detector without interference from the corona gun (see FIG. 2)

Still other variations are possible. In some designs, a separate mask is inserted proximal or at the wafer. Such a design may be used in conjunction with a large working distance corona gun (See FIG. 3).

In some designs, a conical mask with an opening in the center is used. This configuration allows the mask to be close to the sample under test so the charge deposited is concentrated in a small and well-defined area on the wafer. The conical shape also allows the SHG excitation laser light to enter the surface and the resultant SHG signal to pass outside of the measurement site to the detector without interference from the corona gun.

In some systems and methods disclosed herein, to remove or neutralize charge from the dielectric surface, an ionizer such as a light-based ionizer, e.g., a Photon Pin Ionizer (PPI) is used. The ionizer or light-based ionizer or PPI may comprise and/or utilize a source of light such as a source of X-rays, for example, a source of soft X-rays (e.g., a soft X-ray source, a form of light or light source for producing such light) configured to ionize gas and/or provide ionize molecules and neutralize charge, and does not necessarily require an air supply to deliver ionized molecules. X-rays such as soft X-rays may be easily absorbed by the atmosphere and can generate an equal amount of positive and negative ions. These positive and negative ions are attracted to the corona charge, Coulombically, and ultimately neutralizes the corona charge. The goal here is to neutralize (e.g., fully neutralize) the corona charge. This process is an intentional corona removal step in the event that the customer does not want corona charge remaining on the wafer.

The present invention will best be understood from the following description of specific embodiments when read in connection with the accompanying drawings.

DETAILED DESCRIPTION OF THE INVENTION

As discussed in the U.S. Patent Publication No. 2015/0330909 titled "WAFER METROLOGY TECHNOLOGIES" published on Nov. 19, 2015, which is incorporated herein by reference in its entirety, second harmonic generation may be employed to obtain information regarding properties of a sample such as a silicon wafer. A metrology system for obtaining measurements of the sample may include a laser that outputs light that is directed onto the sample and an optical detector that received light reflected from the sample. This light reflected from the sample may comprise a second harmonic generation signal that can be analyzed with electronics to obtain information regarding the sample.

In some implementations, the metrology system may further comprise a corona gun to deposit charge on the sample. Once again, the second harmonic generation signal reflected from the sample may be affected by the presence of charge deposited by the corona gun. Likewise, SHG measurements can be obtained with charge deposited on the sample by the corona gun to provide information regarding the sample. Discussion of use of a corona gun in a metrology system configured to measure second harmonic generation is discussed in U.S. Patent Publication No. 2020/0057104 titled "FIELD-BIASED NONLINEAR OPTICAL METROLOGY USING CORONA DISCHARGE SOURCE" which published on Feb. 20, 2020, which is which is incorporated herein by reference in its entirety.

Various implementations of corona guns used in connection with SHG measurements have features to provide benefits such as (1) concentrating the charge deposited over a smaller region of the sample and/or (2) deposition of charge and/or measurement of SHG signal while the sample remains in situ at the same location relative to the corona gun and the probe laser and optical detector during both charge deposition and SHG signal measurement. The later is in contrast to systems where the sample is situated at a first location for charge deposition by the corona gun and moved to another location for interrogation by the probe laser and measurement of the SHG signal by the optical detector.

Figure 1:
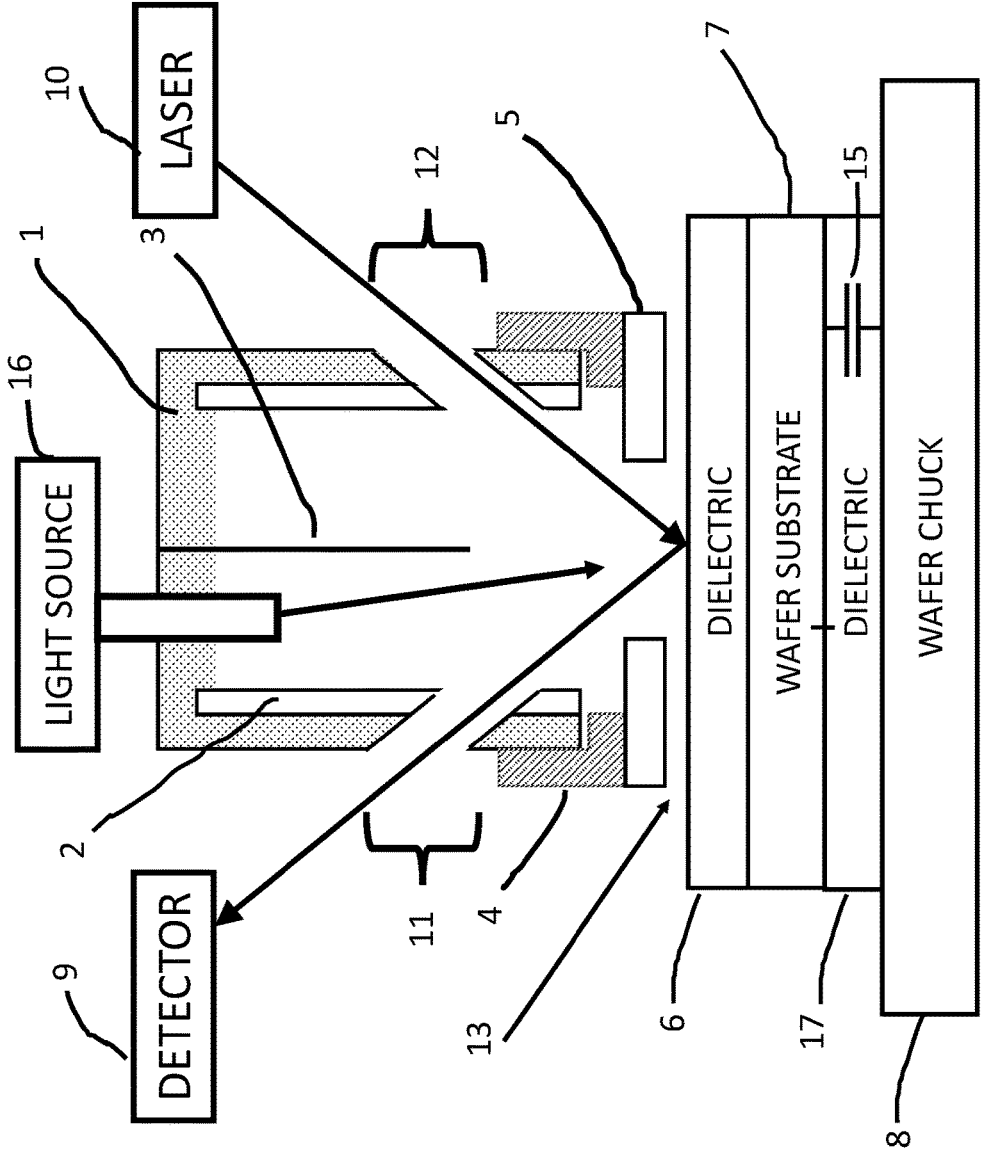
FIG. 1 is a schematic cross-sectional view of a metrology system comprising a laser and detector configured to perform SHG measurements on a semiconductor wafer and a corona gun configured to deposit charge on said wafer. The corona gun includes a corona gun focus ring to reduce the area over which the charge is concentrated on the wafer. The corona gun also includes windows through two sides of the focus ring allowing the interrogating laser light to enter the measurement site and the resultant SHG response signal to exit the focus ring for detection by the optical detect. The corona gun is also positioned such that the semiconductor wafer is within the working distance of the corona gun.

FIG. 1 shows one example metrology system 100 for providing simultaneous corona charging and SHG measurements. The system 100 includes a corona gun for charging a semiconductor wafer 7. The corona gun comprises a corona charge generator 3 comprising a needle, held in position by a frame or holder 1, which may comprise dielectric or insulating material in some implementations. In some designs, the charge generator, e.g., needle, 3 is supported by a high-k dielectric material frame or holder 1. The corona gun may further comprise a focus ring 2 such as a cylindrical metal focus ring configured to focus charge produced by the charge generator (e.g., needle) 3. In some designs, such as shown in FIG. 1, the needle 3 is surrounded by the focus ring 2 as the needle may be within a central open region of the focus ring. In some designs, the frame or holder 1, e.g., high-k needle holder, may support a cylindrical metallic focus ring 2. In various implementations, the corona gun may further comprise a metal mask 5. The metal mask 5 may limit the size (e.g., diameter) of the charge distribution on the sample. In the design shown, a space 4 comprising highly charged dissipative material is connected to the high-k material 1 as well as to the metal mask 5. The highly charge dissipative material spacer 4 provides electrical isolation between the focus ring 2 and the mask 5. There will be a potential difference between the focus ring 2 and the mask 5 since these two components are likely at different voltages. Reducing the capacitance between the focus ring 2 and the mask 5 may advantageously cause charge buildup in the focus ring 2 and/or the mask 5 to be reduced or minimal. Of course, including a metal between and contacting the focus ring 2 and/or the mask 5 would short circuit the mask and focus ring and drive them to the same potential. A low dielectric insulator (low-K) on the other hand would reduce the capacitance between the focus ring 2 and/or the mask 5 and the resultant charge, Q. As Q=CV and C=(K×ε₀×Area)/(distance between plates), capacitance will be low when K is low and so in various implementations a low dielectric constant or highly dissipative material spacer 4 may be employed.

The metrology system further comprises a Second Harmonic Generation (SHG) system. The SHG system shown in FIG. 1 comprises an interrogating or probe laser 10 that is configured to output an interrogating or probe laser beam. The SHG system is configured such that the laser beam is incident on the sample, in the example shown, comprising a semiconductor wafer having dielectric such as oxide thereon. In the example shown, the laser 10 is positioned and oriented with respect to the wafer and dielectric layer on the wafer such that light is incident thereon at an oblique angle. A second harmonic generated light beam is reflected therefrom. The metrology system further comprises an optical detector configured, e.g., positioned and oriented to receive the SHG signal beam or otherwise in the optical path of the SHG beam.

The Second Harmonic Generation system (SHG) is used to measure the EFISH response to an interrogating laser 10, in the presence of a corona induced semiconductor surface bias created by deposited charge on the wafer using the corona gun. In the example shown in FIG. 1, the focus ring 2 is configured to accommodate the probe beam. In particular, the metal focus ring 2 has a window 12 that allows an SHG laser beam output by the SHG probe laser 10 to enter the measurement area through the focus ring wall. As discussed above, this probe beam propagates at an angle such as an oblique angle, for instance a 45 degree angle from the horizontal and/or the wafer and/or the focus ring. The SHG response signed reflected from the semiconductor 7 also passes through the focus ring wall through a second window 11. This SHG signal beam also propagates at an angle such as an oblique angle, for instance, a 45 degree angle from the horizontal and/or the wafer and/or the focus ring. Other angles are possible. For example the angle may be 15°, 2 °, 35°, 45°, 55°, 65°, 75° or any range formed by any of these values or may be larger or smaller in some cases.

In operation a high voltage is applied to the corona charge generator 3, shown in FIG. 1, which is electrically isolated from the focusing ring 2, using the high-k dielectric 1. The mask 5 is used to further focus and shape the corona charge and is positioned over the semiconductor wafer dielectric 6, by a working distance 13. The interrogating laser 10 is incident on the wafer 7 oxide surface 6 to generate a second harmonic, by allowing the laser to pass through a "window" 12 in the focus ring 2 sidewall. The SHG response due to the EFISH, is allowed to pass through the sidewall of the focus ring 2 through a window 11 and reach the optical detector 9.

To provide non-invasive measurement, the semiconductor substrate 7, remains capacitively coupled to the chuck, 15 through the wafer 7 a dielectric 17 covering the backside of the semiconductor wafer. FIG. 1 thus shows the backside capacitor 15, schematically representing backside capacitive coupling, is between the wafer substrate 7 and the chuck 8. One conductor (e.g., conductive plate) of the capacitor 15 comprises the chuck 8. The other conductor (e.g., conductive plate) comprises the semiconductor substrate 7. The backside dielectric 17 is between the two conductors (e.g., capacitive plates). The dielectric 17 on the back side of the wafer 7 are not necessarily the same dielectric material 6 under test. Although SHG measurements do not require any electrically coupled backside to operate (SHG is an optically based measurement), various implementations of corona biasing can involve a return to monitor the corona current flowing while charging, and capacitive coupling 15 is sufficient to pass the current without acting as a bottleneck. The chuck 8 being configured to capacitively couple to the wafer 7, can permit measurement of the electrical properties of a semiconductor wafer without a physical (e.g., ground) contact to the backside wafer substrate and allows for non-contact corona deposition and measuring at the front surface without a wafer movement being needed to perform an SHG measurement after corona charge deposition. Non-contact electrical communication can thus be employed on both the frontside and backside of the wafer, for example, for depositing charge and grounding respectively. Additionally, current may be measured by the non-contact electrical communication (e.g., capacitively coupling) with the wafer so as to provide a quantification of the corona gun charge deposition. Accordingly, various designs, configurations, and methods described herein eliminate the need to scribe the backside oxide 6 to establish an electrical ground for example to measure the corona gun current. Rather, capacitively coupling between, for example, the chuck and the wafer, does not require that an opening in the backside oxide 6 be created and an electrical probe, needle or contact be inserted therein. Not requiring scribing the backside oxide 6 to perform measurements eliminates particle generation and allows for measurements on product wafers. In contrast, other techniques such as Kelvin probe-based methodologies require backside electrical grounding and therefore are invasive.

FIG. 1 shows an optional light source or pump source 16, which can be used to photo-generate electron hole (e-h) pairs. This generation of e-h pairs can be accomplished by using photons with energy that exceeds the semiconductor bandgap. In contrast, the SHG interrogating or probe laser, 10, is configured to output a laser beam having photon energy less than the bandgap of the semiconductor. Accordingly, this interrogating laser beam does not generate electron-hole pairs, however, allows for SHG light to be produced. The SHG light is dependent on e-h pairs produced by the optional light source 16 and varies as the e-h pair decrease after removal of the light from the optical light source. Accordingly, an SHG or EFISH transient response resulting from the electron-hole pair decay can be monitored and provide information regarding the sample.

Figure 2:
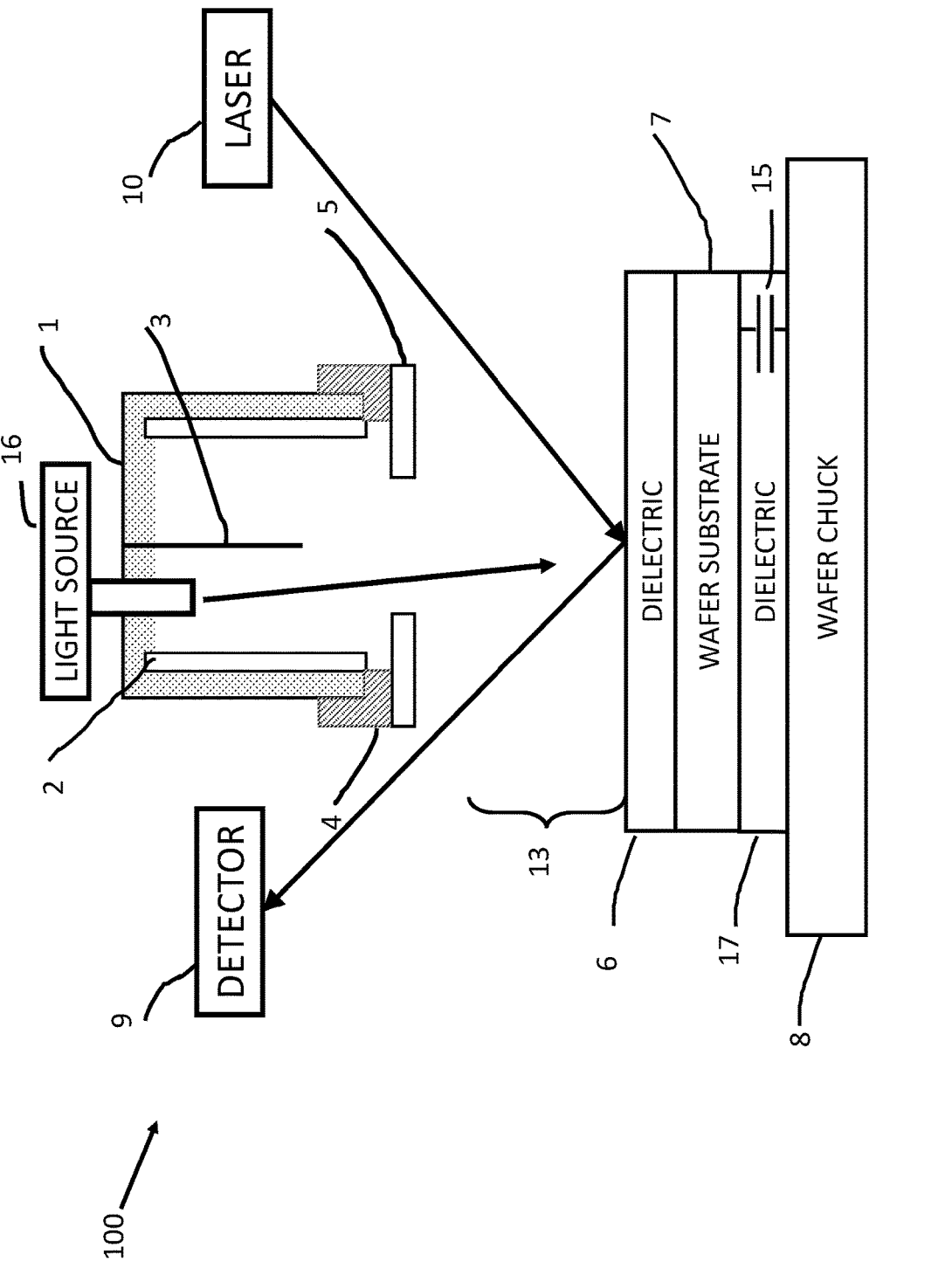
FIG. 2 is a schematic cross-sectional view of a metrology system comprising a laser and detector configured to perform SHG measurements on a semiconductor wafer and a corona gun configured to deposit charge on said wafer. The corona gun has a sufficiently large working distance to allow the interrogating laser light and resultant SHG harmonic light to pass under the corona gun without interference.

Another design is shown in FIG. 2 for providing simultaneous charging and SHG measurements. The metrology system in FIG. 2 includes a corona gun for charging a semiconductor wafer similar to that shown in FIG. 1. The corona gun comprises a corona charge generator (e.g., a needle), 3, and a focus ring 2, which may comprise metal. The corona charge generator or needle 3 and/or the focus ring 2 may be held (e.g., stationary) by a frame or holder, which may comprise dielectric or insulating material such as a high-k dielectric material needle holder 1. The needle 3 is positioned within an open central region of the cylindrical focus ring 2. As shown in FIG. 2, in various designs, the high-k needle holder 1 is held stationary within, above and possibly outside of the cylindrical wall of the metallic focus ring 2. The high-k needle holder 1 may also hold a cylindrical metallic focus ring 2. In various implementations, a portion of this high-k needle holder 1 bridges a gap across the focus ring, and/or provide a central region to fasten to and/or support the corona needle 3. The corona gun further comprises a mask 5, which may provide for a localized concentration with a well-defined perimeter (e.g., diameter) of the charge deposited by the corona gun. In some designs, electrical isolation provides between the focus ring 2 and the mask 5. In some implementations, for example, a spacer 4 comprising highly charged dissipative material holds or supports the stationary the metal mask. As discussed above, in various implementations, the spacer may comprise material having a low-K dielectric thereby reducing the capacitance between the focus ring 1 and the mask 5. The highly charge dissipative material spacer 4 also is connected to the high-k dielectric material of the focus ring 1. Such a configuration provides electrical isolation between the focus ring 2 and the mask 5.

Figure 4:
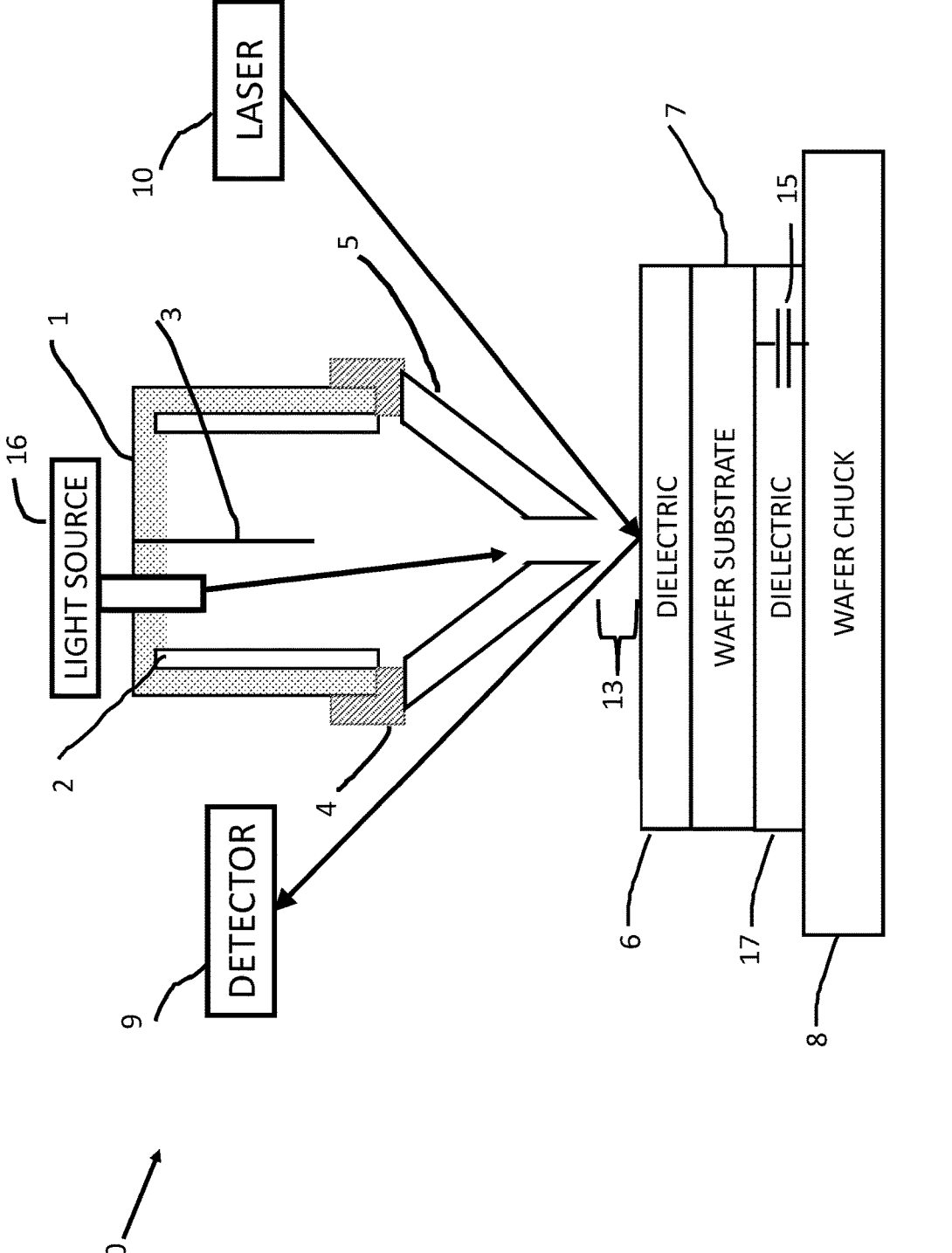
FIG. 4 is a schematic cross-sectional view of a metrology system similar to that shown in FIG. 2 further comprising a conical mask that extends close to the wafer surface and has a sufficiently small aperture such that the charge deposited by the corona gun is concentrated in a small and well-defined area on the wafer. The conical shape of the mask provides for a short working distance configuration and at the same time allowing the interrogating laser light to enter the measurement site and resultant SHG response to exit.

The metrology system shown in FIG. 2 also comprises a Second Harmonic Generation (SHG) system comprising an interrogating laser 10 configured to output a laser beam and an optical detector 9 configured to receive the SHG signal beam from the sample (e.g. from the semiconductor wafer). As discussed above, the Second Harmonic Generation system (SHG) is used to measure the EFISH response to a surface corona charged to create a bias. As illustrated, many of the features of the metrology system, the corona gun and the SHG system are the same as those shown in FIG. 1 and discussed above. However, the focus ring 2 does not have a window 11 for the probe laser beam and SHG signal beam to pass as shown in FIG. 1. Additionally, the metal mask 5 has a larger working distance 13, for instance, ≥10 mm, that allows an SHG laser beam to enter the measurement area by passing below the mask 5 uninterrupted at, for instance, an angle such as at a 45 degree angle from the horizontal or the wafer or the focusing ring. The SHG response beam from the semiconductor 7 also passes below the mask 5 possibly uninterrupted at an angle, for instance a 45 degree angle from the horizontal and/or the wafer and/or the focusing ring. The work distance 13 is sufficiently large to allow the probe beam and SHG signal beam to pass under the corona gun, for example, below the focus ring 1 and in this case the mask 5 also. This work distance 13 may be, for example at least 8 mm, 9 mm, 10 mm, 11 mm, 12 mm, 13 mm, 14 mm 15 mm, 20 mm, 25 mm or any range formed by any of the values or possibly outside these ranges. In some cases, the larger the working distance, the larger is the corona gun beam diameter. In some implementations, the beam spot size of the corona gun beam may be reduced by reducing the aperture, however, this can result in lower beam intensity for some designs. The corona gun with a conical shape mask such as shown in FIG. 4 and discussed more below may limit the spot size yet maintain higher beam intensity. The optical detector 9 is configured to receive the SHG signal beam for measurement.

Figure 3:
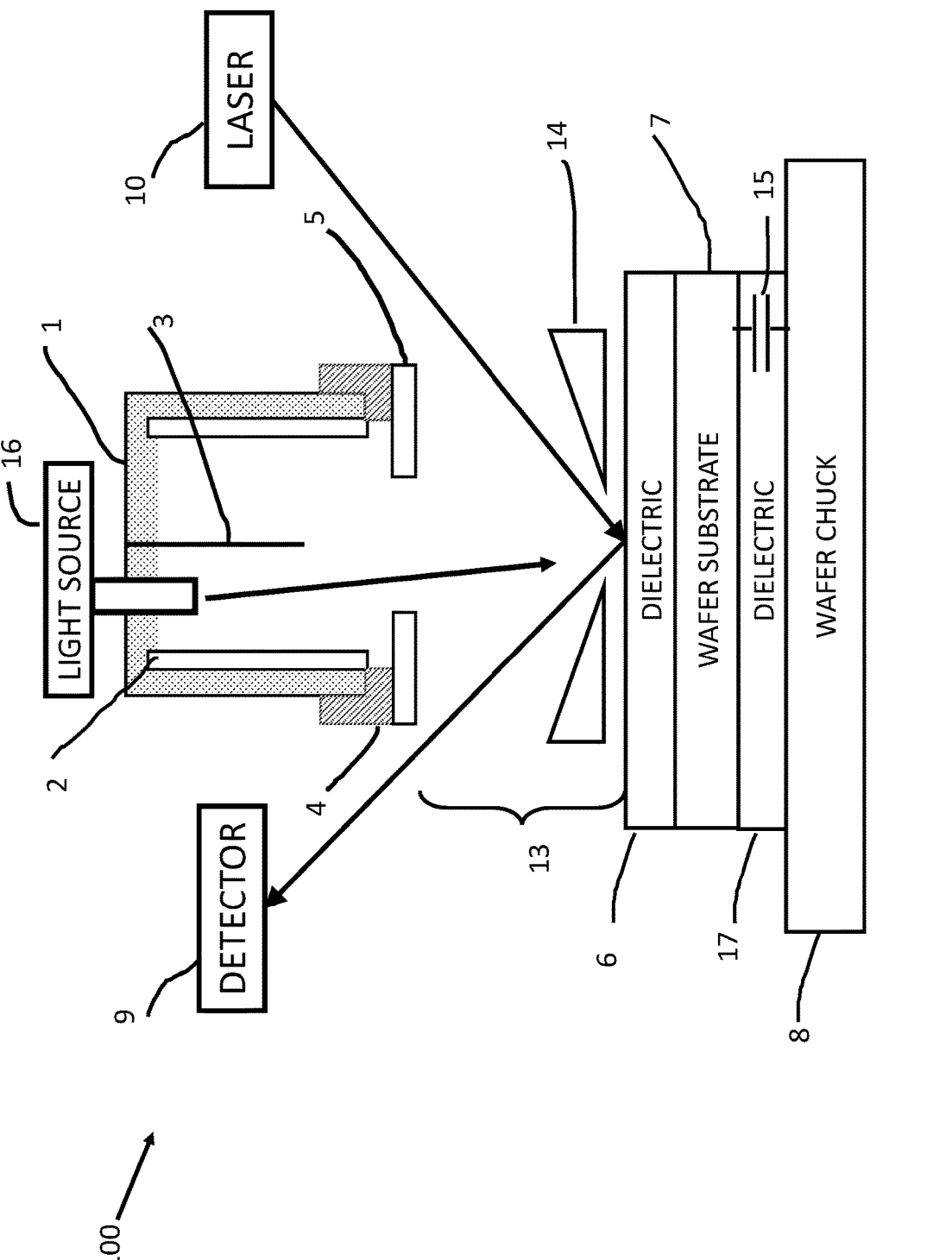
FIG. 3 is a schematic cross-sectional view of a metrology system similar to that shown in FIG. 2 further comprising a separate mask inserted just above the wafer and used in conjunction with the large working distance corona gun of FIG. 2.

FIG. 3 shows a metrology system configured for simultaneous corona gun charging and SHG measurements similar to that shown in FIG. 2 further comprising a second mask 14, closer to the sample (e.g., wafer), than the first mask 5. The second mask may include a central opening, for example, may comprise a ring having a central opening. The center opening may be, for example, 1-1.5 mm wide. The second mask 14 may also have a smaller thickness toward the center than farther from center the center. As shown in FIG. 3, the second mask has a tapered cross-section that may, for example, be triangular or trapezoidal or have another cross-sectional shape, for example, along a radial line extending from the center of the mask. In various implementations, the second mask 14 has a sloping upper surface that slopes such that the upper surface is closer to the sample or wafer closer to the center of the mask and farther from the sample or wafer farther from the center of the mask. This sloping upper surface may, for example, have a side angle of 45 degrees or larger. In various implementations, the angle maximum may be determined by the laser beam angle. For example, if the laser beam angle was 45 degrees with respect to the normal to the wafer and/or chuck, then the maximum angle of the mask sidewall with respect to the wafer and/or chuck maybe be 45 degrees, however, other angles measured with respect to the wafer and/or chuck that are smaller than 45 degrees may works as well in certain designs. The angle may also be measured with respect to a central axis or centerline through the focus ring 2. In various implementations, the lower surface is parallel or at least more parallel to the surface of the chuck that supports the wafer than the upper surface. The second mask 14 in FIG. 3, may be used to help reduce corona electric field line fringing effects that are enhanced by large working distance configurations and thereby produces a more focused corona beam profile on the sample surface, e.g., on the dielectric surface 6. The tapered shape of the second mask 14 may allow for the laser beam to be incident on the sample/wafer at an oblique angle possibly without obstructing the beam. Similarly, the tapered shape of the second mask 14 may allow for SHG light from the sample/wafer to be collected at an oblique angle reduced obstruction. In various implementations, for example, the laser beam enters mask 14 at a 45 degree angle from the horizontal, and is absorbed by the wafer 7, and an SHG response from the semiconductor 7 passes back through the central open region of the second mask 14 at, for instance at a 45 degree angle from the horizontal, uninterrupted and into the detector 9. In various implementations, the loss in charge due to the large working distance is compensated for by increasing the corona current by increasing the voltage, e.g., with respect to the chuck 8, on the corona needle 3, for instance, by increasing the voltage on the corona needle such that the charge generation is increased by 25× or more. In various implementations, the corona current flowing into the chuck 8 is monitored. In various designs, the corona needle 3 potential can be adjusted to achieve a desired corona current.

FIG. 4 shows another metrology system for simultaneous charge and SHG measurements similar to the apparatus of FIG. 1, wherein the first mask 5 is of the shape of a cone with an opening in the center for the corona charges to pass. The mask 5 may comprise conducting material such as metal with sloping sidewalls such that the mask gets narrower or smaller in width with distance farther from the needle 3 and the focus ring 2. This configuration allows the corona gun to have a short working distance 13, which will give us a well-controlled corona beam. The work distance is measured from the part of the corona gun that is closest to the sample, here the first mask 5, to the sample. The conical shape, the sloping sidewall, and the tapering width, also allow an SHG laser beam to enter the measurement area below the corona gun and in particular below that first mask 5 at an oblique angle, such as for instance at a 45 degree angle with respect to the horizontal or the wafer/sample or the corona gun.

Figure 5:
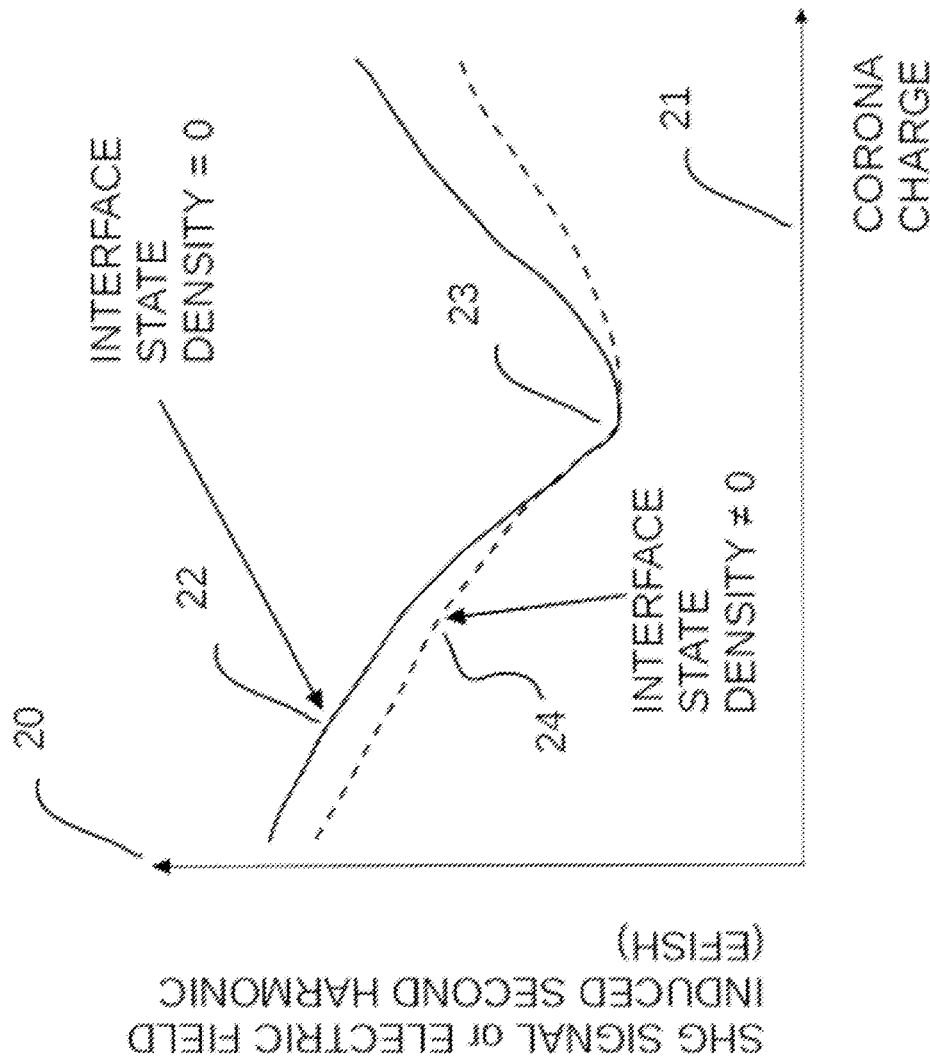
FIG. 5 is a plot on axis of SHG signal (arbitrary units) and corona gun charge (arbitrary units) of SHG signal obtain for varying levels of corona gun charge (e.g., net corona gun charge deposited). The plot includes a set of two SHG versus net corona charge curves: one with the effects of interface state density and one without. A first SHG curve 24 represents the actual SHG versus charge curve just measured. The reference curve 22 represents an SHG versus charge curve from a reference sample that has extremely low interface state density (Dit), or a theoretical SHG versus charge curve, with zero interface state density, which is obtained from modeling. The difference between the two curves 22, 24 must represent deviation from ideal due to interface state density (Dit).

The metrology systems shown in FIGS. 1-4 can advantageously be employed to determine the total charge (or net charge) trapped in the oxide due to defects ($Q_{tot}$). This measurement can be obtained by observing the variation of the second harmonic generation signal with applied corona charge. FIG. 5 is a plot of EFISH 20 versus corona charge 21; see, e.g., curve 24. The total charge or net charge trapped in the oxide due to defects, $Q_{tot}$, can be determined from the point on the EFISH 20 versus corona charge 21 curve 24 with low second harmonic generation signal, e.g., at the "position" 23. Curve 24 shows the dependency of EFISH on variation of corona charge for the case where the interface state density ($D_{it}$) is not zero but is significant in causing distortion of the second harmonic generation signal and the EFISH versus charge curve and is significant in contributing interface state charge ($Q_{it}$) to the total charge $Q_{tot}$. In certain implementations, to determine the total charge in the oxide, corona charge is deposited on the surface of the dielectric 6 on the semiconductor sample (e.g., FIGS. 1-4) and the EFISH signal is monitored until the EFISH reaches its low or minimum, 23. At this point, the charge applied to produce the low or minimum 23 is equal to the magnitude of $Q_{tot}$, and negative to the total charge, $-Q_{tot}$, in polarity. $D_{it}$ simply gives rise to some trapped charge that contributes a component of $Q_{tot}$. $Q_{tot}$ is the total charge in the oxide. This charge occurs through defects in the oxide, and at the oxide/semiconductor interface (DO. This charge, $Q_{tot}$, in the oxide, images itself through Gauss's law in the semiconductor surface as $-Q_{tot}$. To achieve the $-Q_{tot}$, a potential develops in the semiconductor surface which has polarity and increases the SHG response. The production and effect of this potential is often referred to as "band bending". To measure $Q_{tot}$, enough charge is deposited on the oxide surface through the corona gun discharge to achieve $-Q_{tot}$ on the oxide surface. When $-Q_{tot}$ is obtained, the drive for the oxide $Q_{tot}$ to image itself in the semiconductor dissipates. $Q_{tot}$ is now imaging itself on the oxide surface through $-Q_{tot}$ that was deposited. When this state is achieved, a minimum 23 in the SHG versus corona charge curve 24 can be observed.

Additionally, the interface state density, $D_{it}$, can be determined by comparing the EFISH 20 versus corona charge 21 curve 24 of the sample under test, with significant $D_{it}$ to distort the curve, with an EFISH versus corona charge curve 22 that is experimentally obtained for a like sample that has very low $D_{it}$. As discussed above, the two curves represent the sample under test with presumably significant Dit, 24, and a curve from either a low-Dit reference sample, or a theoretical SHG versus corona charge curve 22 for low –Dit generated using a theory based model.

An EFISH 20 versus corona charge 21, curve 22 for a like sample that has very low $D_{it}$ can be obtained by modeling based EFISH versus corona charge curve that excludes any contribution from $D_{it}$, but includes other forms of contribution, possibly all forms of contributions, to the EFISH versus corona charge curve. The difference between the two curves 24 and 22, yield the interface state density of varying positions along the corona charge 21 axis.

Figure 6:
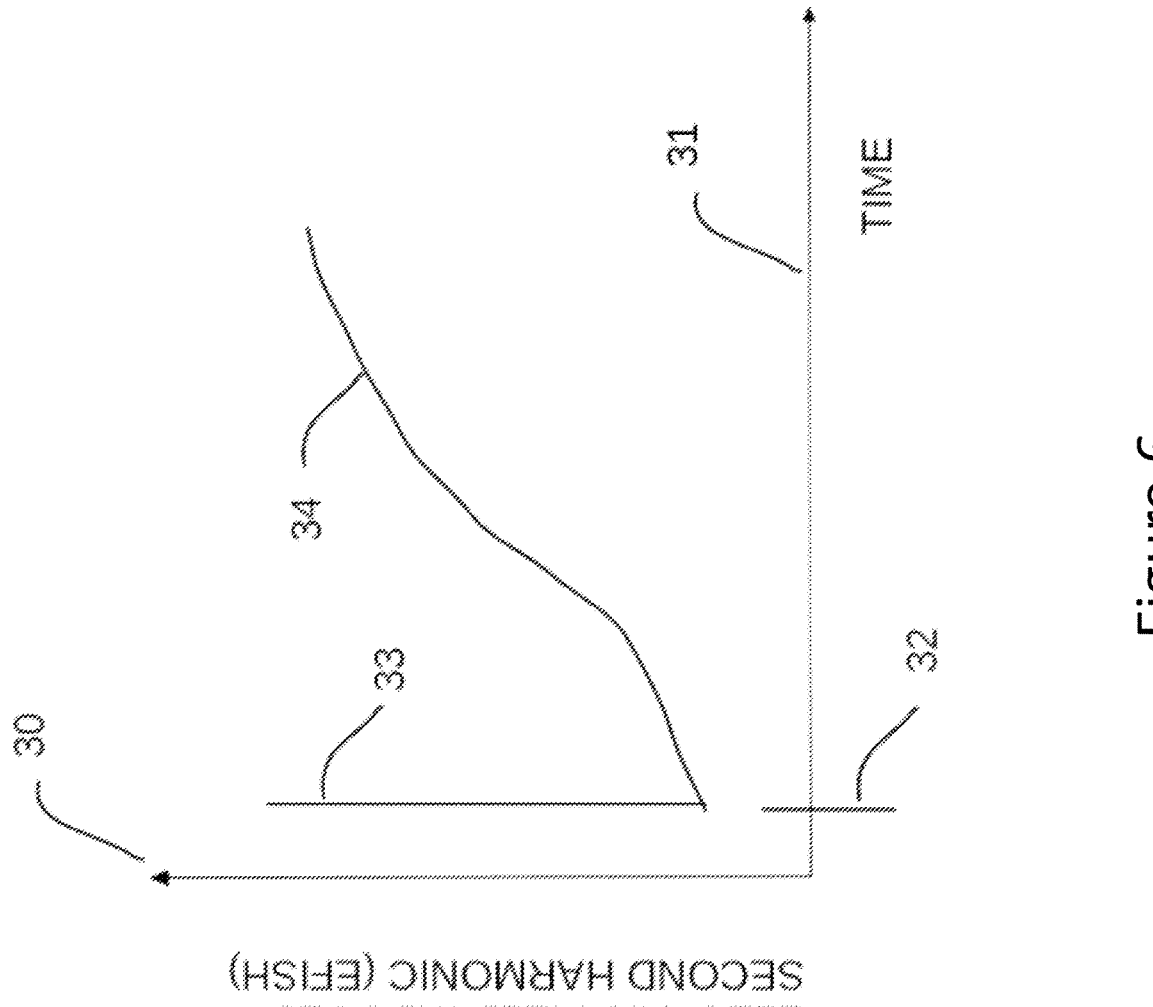
FIG. 6 is a plot on axis of SHG signal (arbitrary units) versus time (arbitrary units) showing the variation of SHG signal over time. The SHG versus time curve shows the response produced by illumination of the semiconductor sample by light from a pulsed above-bandgap laser that temporarily induces forward biasing the semiconductor surface.

Referring now to FIG. 6, the auxiliary or pump light source 16 shown in FIGS. 1-4, is used to photo-generate electron-hole pairs. As discussed above, this generation of e-h pairs is accomplished by using photons with photon energy that exceeds the semiconductor bandgap. In contrast, the SHG interrogating or probe laser 10 is characterized by and outputs a beam of sub-bandgap photon energy light, which does not generate electron-hole pairs and allows for the EFISH transient response to the electron-hole pair decay to be monitored. The semiconductor surface is first prepared by forming an accumulation region in the semiconductor by depositing positive corona charge on the oxide, for underling n-type semiconductors, or negative corona charge, for p-type underlying semiconductors. This establishes the semiconductor surface to be in accumulation. Next, in various implementations, a depletion and inversion region is formed overtop of a portion of, but not all of the accumulation region, nulling the accumulation region, for example, for a lateral size, e.g., diameter, smaller than the lateral size of the accumulation region, e.g., the accumulation region diameter. This is accomplished by depositing positive charge for p-type semiconductors or negative charge for n-type semiconductors. Since the lateral size, e.g., diameter, for the depletion/inversion region is smaller than the lateral size, e.g., diameter, of the charge deposited for the accumulation region and is within, e.g., centered with the accumulation region, the resultant field induced junction is a size, e.g., diameter, of depleted/inverted semiconductor surface surrounded by an accumulation region, e.g., annular region or ring, in the semiconductor. This result can be accomplished using the apparatus of FIGS. 1-4.

As seen in FIG. 6, a plot of the SHG based EFISH 30 versus time 31 can be used to identify the point in time 32 where the EFISH changes 33 due to the pulsed laser light as well as the decay of the change in EFISH as photo-generated electron-hole pairs decay. Before the semiconductor surface is pulsed with the pump laser or light source, the SHG signal has a component due to the electric field at the semiconductor surface called EFISH. Upon pulsing the surface with above bandgap light, electron-hole pars (e-h pairs) are created which collapse, momentarily, the EFISH resulting in a reduced SHG signal. Upon cessation of the above bandgap light from auxiliary or pump laser or light source 16, photo-generated electron-hole pairs recombine through interaction with defects having energy levels positioned in the forbidden energy gap. The SHG signal (or EFISH component) subsequently returns to its pre-laser or light flash magnitude at a rate commensurate with the charge carrier recombination lifetime.

Figure 7:
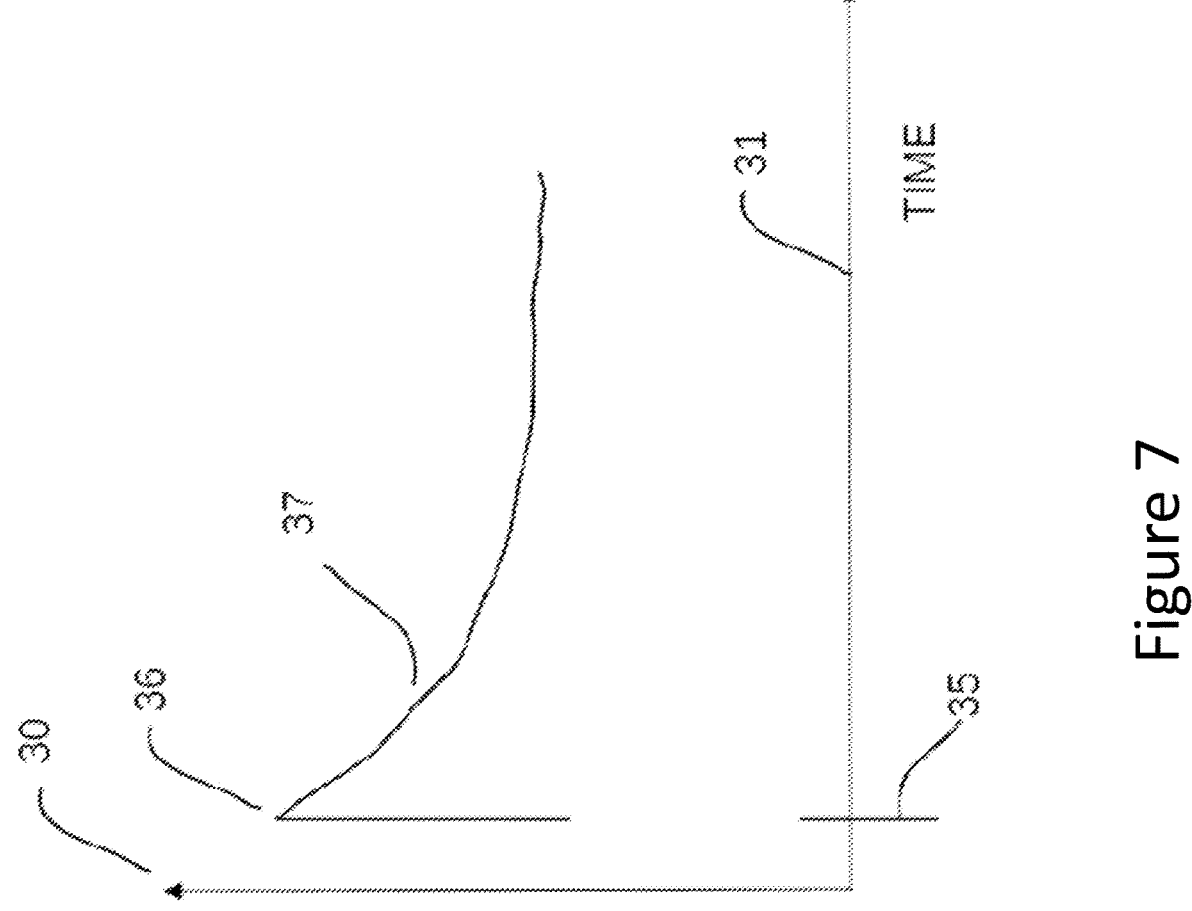
FIG. 7 is a plot on axis of SHG signal (arbitrary units) versus time (arbitrary units) showing the variation of SHG signal over time. The SHG versus time curve shows a response produced by a pulsed corona packet of charge temporarily driving the semiconductor surface into deep depletion.

Referring now to FIG. 7, the generation lifetime can be measured by pulsing the semiconductor surface into a state of deep depletion using a short duration packet of corona charge. The semiconductor surface is first prepared by forming a depletion and inversion region such as for example with a mask 5, 14 or accumulated guard ring surrounding the region as discussed above, when using the apparatus of FIGS. 1-3. The corona source quickly deposits a packet of charge and, the surface is driven into deep depletion as demonstrated by 36 in FIG. 7 at a time 35. This packet of corona charge, increases the electric field in the semiconductor surface, and the resultant EFISH and SHG. A plot of the EFISH 30 versus time 31 shows the EFISH signal 36 enhanced by the pulse of corona charge. A plot of the EFISH 30 versus time 31 also shows the decay of the EFISH 37 after application of the corona charge pulse, as minority carriers are generated and the space charge region collapses from one of deep depletion to one of depletion and inversion. The EFISH signal 30 returns to its prior pre-corona pulse value or proximal thereto after the application of the corona charge has ceased (e.g., after completion of the corona gun pulse and the subsequent resultant decay of the EFISH signal). The rate that the deep depleted surface relaxes is related to the generation lifetime.

A variety of designs, configurations and methods are described herein. Various of the designs, configurations and method described herein provide different advantages. For example, various configurations of the metrology system described herein (e.g., such as shown in FIGS. 1-4) comprise a metrology system for performing corona deposition and measuring the SHG response with the corona bias present without requiring a wafer move between corona deposition and SHG measurement. As a result, SHG measurements can be conducted at the same time as corona charge is being deposited or has just been deposited. The wafer need not be at a first location when the corona charge is deposited and at a second location to when the SHG laser beam is directed onto the region of the sample where corona charge has been deposited and the SHG signal detected to perform the SHG measurements.

Various designs, configurations, and methods described herein eliminate the need to scribe the backside oxide 6 to establish an electrical ground for example to measure the corona gun current. Rather, capacitively coupling between, for example, the chuck and the wafer, does not require that an opening in the backside oxide 6 be created and an electrical probe, needle or contact be inserted therein. Not requiring scribing the backside oxide 6 to perform measurements eliminates particle generation and allows for measurements on product wafers. In contrast, other techniques such as Kelvin probe-based methodologies require backside electrical grounding and therefore are invasive.

Various systems described herein advantageously enable controlled, e.g., precisely controlled, corona deposition for possible use for semiconductor wafer testing that may be a non-contact, non-invasive method for testing such wafers.

Various examples of metrology systems for preforming measurements on a sample such as a semiconductor wafer wherein the metrology system comprises a corona gun, a laser configured to provide an interrogating beam to the sample and an optical detector configured to detect light from the sample are described herein such as the examples enumerated below:

Part I

Example 1: An apparatus for performing simultaneous corona charging and Second Harmonic Generation (SHG) measurements, eliminating a wafer move between charging and measurement, comprising: a long working distance corona gun to not block the SHG interrogating laser that enters the measurement area at an angle that permits the laser beam to enter uninterrupted.

Example 2: The apparatus of Example 1 where the interrogating laser is replaced by either two lasers or a multimode laser that produces beams with two frequencies of light, and the SHG measurement is replaced by sensing the sum or difference of the two incident frequencies from the interrogation laser(s).

Example 3: The apparatus of Example 1, further comprising a working distance that allows the laser beam to enter the measurement area uninterrupted.

Example 4: The apparatus of Example 3, further comprising increased corona generation for losses due to the large working distance.

Example 5: An apparatus for performing simultaneous corona charging and SHG measurements, eliminating a wafer move between charging and measurement, comprising: a focus ring with entrance and exit windows to allow SHG signal to pass the corona gun, uninterrupted.

Example 6: The apparatus of Example 5 configured to reduce or eliminate corona leakage that may charge regions of the wafer, not intended for charging. For leaky oxides, the time between corona deposition and subsequent measurement may be short.

(Accordingly, with a wafer move between deposition and measurement, charge will leak. If the corona source and SHG response are positioned at the same location and a wafer move is not needed, the time between corona deposition and subsequent measurement is reduced and less corona charge is leaked.)

Example 7: The apparatus of Example 5 that uses additive manufacturing (e.g., 3D printing) to reduce the complexity in producing precise window positions in the focus ring during manufacturing.

(The window positions may be made much easier and more precise based on using additive manufacturing (part "printing" or 3D printing), rather than machining (or subtraction-based methods like milling).

Example 8: An apparatus for performing simultaneous corona charging and SHG measurements, eliminating a wafer move between charging and measurement, comprising: the insertion of a second mask positioned between the wafer at a small working distance above the wafer and a corona gun that includes a first mask placed a large working distance above the wafer surface.

Example 9: The apparatus of Example 8 wherein, the second mask will be a metal cone with center opening 1-1.5 mm.

(For FIG. 3, for example, the cone would be the second mask 14 placed close to the semiconductor surface. For FIG. 4, the corona gun includes a single mask 5, shaped as a cone as well, placed at the bottom of the corona gun.)

Example 10: The apparatus of Example 8 wherein the side angle of the second mask should be larger than 45 degrees, which will allow the laser light to go in and out without blocking.

Example 11: The apparatus of Example 8 wherein losses in corona charge due to aperture restriction are compensated by increasing the charge generation significantly.

Example 12: A method for measuring total charge, interface state density and charge carrier lifetime non-invasively comprising electrically contactless, non-invasive, non-intrusive and electrically ungrounded measurements for testing a doped wafer with an insulator layer disposed thereover.

Example 13: The method of Example 12, wherein the minimum in a SHG versus corona charge curve yields the total charge.

Example 14: The method of Example 12, wherein the difference between an experimentally acquired SHG versus corona charge curve and a modeled SHG versus corona charge curve, the modeled curve excluding the effects of interface density, yields the interface state density.

Example 15: The method of Example 12 comprising depositing charges on the top surface of said insulator layer to create an accumulated semiconductor surface, a depleted semiconductor surface or a depleted and inverted semiconductor surface and thereby a field-induced junction in the wafer therebelow with an accumulated guard ring on the wafer surface.

Example 16: The method of Example 15 comprising changing the depth to which said depletion region extends below said inverted wafer surface to create a surface electric field induced second harmonic (EFISH) transition, and the resultant surface EFISH.

(For example, after the field induced junction is formed using corona charge to create the depletion/inverted region surrounded by an accumulated guard ring, a packet of positive charge for p-type semiconductors or a packet of negative charge for n-type semiconductors is quickly deposited on top of the existing field-induced junction. The semiconductor does not have time to generate additional inversion charge so it momentarily goes into a state of deep depletion to respond to the packet of charge. During a period of time thereafter, the inversion charge begins to generate and the deep depletion condition relaxes. The rate at which this changes back to inversion and not deep depletion is related to the generation lifetime.)

Example 17: The method as defined in Example 16, wherein said charge depositing step comprises the step of depositing charges using at least one corona discharge.

Example 18: The method as defined in Example 16, wherein said depletion depth changing step comprises the step of applying a second corona discharge on the top surface of said insulator layer above said accumulated, depleted or depleted and inverted surface area.

Example 19: A method as defined in Example 16, wherein said depletion depth changing step includes the steps of pulsing said wafer above said depletion region deeper into depletion relative to the steady state depletion resulting from said charge depositing step; measuring the approximate instantaneous EFISH transient at the semiconductor/insulator layer interface.

Example 20: The method as defined in Example 16, wherein said depletion depth changing step comprises the step of imposing a forward bias across said field-induced junction by injecting above bandgap photons into said depletion region to generate electron-hole pairs therein.

Example 21: The method as defined in Example 20, wherein said injecting above bandgap photons causing the depletion region in the semiconductor wafer to decrease in depth and measuring the approximate instantaneous EFISH transient at the semiconductor/insulator layer interface.

Example 22: The method as defined in Example 16, wherein said SHG measured EFISH transient does not require the semiconductor wafer under test to be grounded.

Example 23: The method of Example 15 that measures the onset of Fowler-Nordheim tunneling, when the SHG signal no longer changes upon adding additional charge to the wafer surface.

Example 24: The method of Example 15 that measures the steady state leakage current by simultaneously depositing charge while measuring the SHG. While depositing the charge, once the SHG is no longer increasing, the corona deposition rate is equals the leakage current.

Example 25: A method of neutralizing deposited corona charge using a Photon Pin Ionizer which utilizes a soft X-ray source, a form of light, and does not require an air supply to deliver ionized molecules.

Part II: Focus Ring with Windows for Input Beam and Output Beam

Example 1. A system for optically interrogating a sample accompanied by the application of electric charge to said sample, said system comprising:

an optical source configured to emit an incident light beam towards said sample;

a corona discharge source disposed with respect to the sample to provide electric charge to the sample; and an optical detection system configured to detect an output light beam from the sample, wherein said corona discharge source comprises a focus ring comprising at least one wall, said at least one wall having a first window for passage of said incident light beam from said optical source at an oblique angle to said sample.

Example 2. The system of Example 1, wherein said at least one wall of said focus ring has second window for passage of said output light beam from said sample to said optical detection system at an oblique angle with respect to said sample.

Example 3. The system of any of the Examples above, wherein said output light beam comprises a second harmonic generation (SHG) light beam.

Example 4. The system of any of the Examples above, wherein said focus ring has a tubular shape.

Example 5. The system of any of the Examples above, wherein said corona discharge source further comprising a needle for emission of charge, said needle surrounded on opposite sides by said focus ring.

Example 6. The system of any of the Examples above, wherein said at least one wall of said focus ring has a tubular shape.

Example 7. The system of any of the Examples above, wherein said first window is disposed with respect to said optical source and said sample such that said incident light beam is incident on said sample at an angle of between 20 and 70 degrees with respect to a normal to said sample.

Example 8. The system of any of the Examples above, wherein said first window is disposed with respect to said optical source and said sample such that said incident light beam is incident on said sample at an angle of between 30 and 60 degrees with respect to a normal to said sample.

Example 9. The system of any of the Examples above, wherein said corona discharge source further comprises a mask closer to said sample than said focus ring.

Example 10. The system of any of the Examples above, wherein said corona discharge source further comprises a mask closer to said sample than said focus ring, said mask attached to said focus ring.

Example 11. The system of any of the Examples above, further comprising a wafer chuck for supporting said sample.

Example 12. The system of any of the Examples above, wherein said system comprises an inline system configured to be included inline of a semiconductor device processing line.

Example 13. The system of any of the Examples above, further comprising a pump light source for providing additional light to said sample.

Example 14. The system of any of the Examples above, wherein said focus ring comprises a 3-D printed focus ring.

Example 15. The system of any of the Examples above, wherein said focus ring is at least in-part formed by additive manufacturing.

Example 16. The system of any of the Examples above, wherein said focus ring is at least in-part formed by 3-D printing.

Example 17. The system of any of the Examples above, wherein said window in said focus ring is at least in-part formed by additive manufacturing.

Example 18. The system of any of the Examples above, wherein said window in said focus ring is at least in-part formed by 3-D printing.

Example 19. The system of any of the Examples above, wherein said window of said focus ring is positioned a least in-part using 3-D printing.

Example 20. The system of any of the Examples above, wherein said window of said focus ring comprise a 3-D printed window.

Part III: Corona Discharge Source with Large Working Distance

Example 1. A system for optically interrogating a surface of a sample accompanied by the application of electric charge to said sample, said system comprising:

an optical source configured to emit an incident light beam towards said sample;

a corona discharge source disposed with respect to the sample to provide electric charge to the sample; and an optical detection system configured to detect an output light beam from the sample, wherein said corona discharge source has a working distance of from 8 to 25 millimeters (mm) to provide a region between said corona discharge source and said sample for access of said incident light beam to said sample at an oblique angle to said sample.

Example 2. The system of any of the Examples above, wherein said output beam comprises a second harmonic generation (SHG) light beam.

Example 3. The system of any of the Examples above, wherein said working distance is from 10 to 20 mm.

Example 4. The system of any of the Examples above, wherein said incident light beam is incident on said sample at an angle of between 20 and 70 degrees with respect to a normal to said sample.

Example 5. The system of any of the Examples above, wherein said incident light beam is incident on said sample at an angle of between 30 and 60 degrees with respect to a normal to said sample.

Example 6. The system of any of the Examples above, wherein said corona discharge source further comprises a needle for emission of charge, said needle surrounded on opposite sides by said focus ring.

Example 7. The system of any of the Examples above, wherein said corona discharge source further comprises a focus ring and a first mask closer to said sample than said focus ring.

Example 8. The system of Example 7, wherein said first mask is attached to said focus ring.

Example 9. The system of Example 7 or 8, further comprising a second mask, said second mask closer to said sample than said first mask.

Example 10. The system of any of Examples 7-9, wherein said second mask has an opening, said second mask having a thickness closer to said opening than farther from said opening.

Example 11. The system of any of Example 10, wherein said second mask has a tapered thickness, with smaller thickness closer to said opening than farther from said opening.

Example 12. The system of any of the Examples above, further comprising a wafer chuck for supporting said sample.

Example 13. The system of any of the Examples above, wherein said system comprise an inline system configured to be included inline of a semiconductor device processing line.

Example 14. The system of any of the Examples above, further comprising a pump light source for providing additional light to said sample.

Part IV: Conical Mask

Example 1. A system for optically interrogating a sample accompanied by the application of electric charge to said sample, said system comprising:

an optical source configured to emit an incident light beam towards said sample;

a corona discharge source disposed with respect to the sample to provide electric charge to the sample; and an optical detection system configured to detect an output light beam from the sample, wherein said corona discharge source comprises a mask having a tapered width to allow for access of said incident light beam to said sample at an oblique angle to said sample and for access of said output light beam at an oblique angle from said sample to said optical detection system.

Example 2. The system of any of the Examples above, wherein said mask is conical in shape.

Example 3. The system of any of the Examples above, wherein said mask comprises conductive material.

Example 4. The system of any of the Examples above, wherein said mask comprises metal.

Example 5. The system of any of the Examples above, wherein said mask is tapered at an angle of between 20 and 70 degrees with respect to a normal to said sample.

Example 6. The system of any of the Examples above, wherein said mask is tapered at an angle of between 30 and 60 degrees with respect to a normal to said sample.

Example 7. The system of any of the Examples above, wherein said mask is tapered at an angle of between 35 and 55 degrees with respect to a normal to said sample.

Example 8. The system of any of the Examples above, wherein said output beam comprise a second harmonic generation (SHG) light beam.

Example 9. The system of any of the Examples above, wherein said corona discharge source comprises focus ring.

Example 10. The system of Example 9, wherein said corona discharge source further comprises a needle for emission of charge, said needle surrounded on opposite sides by said focus ring.

Example 11. The system of any of Examples 9-10, wherein said mask is closer to said sample than said focus ring.

Example 12. The system of any of Examples 9-11, wherein said mask is attached to said focus ring.

Example 13. The system of any of Examples 9-11, wherein said mask is attached to said focus ring via a spacer comprising highly charge dissipative material.

Example 14. The system of any of Examples 9-13, wherein said mask is attached to said focus ring via an insulating needle holder.

Example 15. The system of any of Examples 9-14, wherein said mask is attached to an insulating needle holder via a spacer comprising highly charge dissipative material.

Example 16. The system of any of the Examples above, wherein said incident light beam is configured to be incident on said sample at an angle of between 20 and 70 degrees with respect to a normal to said sample.

Example 17. The system of any of the Examples above, wherein said incident light beam is configured to be incident on said sample at an angle of between 30 and 60 degrees with respect to a normal to said sample.

Example 18. The system of any of the Examples above, further comprising a wafer chuck for supporting said sample.

Example 19. The system of any of the Examples above, wherein said system comprise an inline system configured to be included inline with a semiconductor device processing line.

Example 20. The system of any of the Examples above, further comprising a pump light source for providing additional light to said sample.

Part V: Capacitive Coupling

Example 1. A system for optically interrogating a sample accompanied by the application of electric charge to said sample, said system comprising:

an optical source configured to emit an incident light beam towards said sample;

a corona discharge source disposed with respect to the sample to provide electric charge to the sample;

an optical detection system configured to detect an output light beam from the sample; and a sample support platform configured to be capacitively coupled to the sample.

Example 2. The system of any of the Examples above, wherein said sample support platform comprises a wafer chuck.

Example 3. The system of any of the Examples above, further comprising electronics in electrical communication with said sample support platform to measure current from said wafer to said sample support platform via said capacitive coupling.

Example 4. The system of any of the Examples above, wherein said capacitive coupling removes the need to provide an electrode that passes through an insulating layer on a backside of said sample.

Example 5. The system of any of the Examples above, wherein said output beam comprises a second harmonic generation (SHG) light beam.

Example 6. The system of any of the Examples above, wherein said system comprise an inline system configured to be included inline of a semiconductor device processing line.

Example 7. The system of any of the Examples above, further comprising a pump light source for providing additional light to said sample.

Part VI—Density of States

Example 1. A system for optically interrogating a sample accompanied by the application of electric charge to said sample, said system comprising:

an electrode configured to place charge on the sample, said electrode spaced apart from the sample;

a probe optical source configured to emit probing light, said probe optical source disposed so as to direct said probe light onto said sample;

an optical detector configured to detect second harmonic (SHG) generated light from the sample in response to said probe light directed thereon; and electronics configured to vary the amount of charge deposited on or in said sample and/or the charging of the sample such that said optical detector detects a variation in the Second Harmonic Generation (SHG) light generated by the varying amounts of charge and/or charging;

said electronics configured to estimate an interface state density based on a comparison between (a) a first dependency of the SHG versus charge on the surface of the sample and (b) a second dependency of SHG versus charge on the surface of the sample, wherein said first dependency comprises measured SHG versus charge.

Example 2. The system of Example 1, wherein said electronics are configured to estimate an interface state density based on a comparison between (a) the dependency of the measured SHG versus charge deposited and (b) a modeled dependency of SHG versus deposited charge.

Example 3. The system of Example 1 or 2, wherein said electronics are configured to estimate an interface state density based on a comparison between (a) the dependency of the measured SHG versus charge deposited and (b) a stored dependency of SHG versus deposited charge.

Example 4. The system of any of Examples 1-3, wherein said electronics are configured to estimate an interface state density based on a comparison between (a) a dependency of the measured SHG versus charge deposited and (b) a dependency of SHG versus deposited charge for a sample having less states.

Example 5. The system of any of Examples 1-4, wherein said electronics are configured to estimate an interface state density based on a comparison of (a) the shape of a first curve of SHG versus charge on the surface of the sample and (b) the shape of a second curve of SHG versus charge on the surface of the sample, wherein said first curved comprises measured SHG versus charge.

Example 6. The system of any of Examples 1-5, wherein said system is configured to form a guard region with charge having a first polarity and an inner region surrounded by said guard region having a second polarity having opposite said first polarity.

Example 7. The system of any of Examples 1-6, wherein said electrode is include in a corona gun.

Example 8. The system of Examples 1-4 and 6-7, wherein said comparison comprises the difference in values of SHG for different amounts of applied charge.

Part VII—Guard Ring

Example 1. A method of optical interrogation of a sample, the method comprising:

depositing electrical charge on or in the sample and/or charging the sample;

forming a guard region with charge having a first polarity and an inner region surrounded by said guard region having a second polarity having opposite said first polarity;

applying probing radiation from a probing optical source to the sample, said probe radiation incident on said inner region; and detecting using an optical detector, Second Harmonic Generation (SHG) effect light generated by the probing radiation with said electrical charge deposited on or in the sample and/or charging of the sample.

Example 2. The method of Example 1, wherein forming said guard region and said inner region comprises depositing charge of said first polarity over a larger area and depositing charge of said second polarity over a smaller area within said larger area such that said guard region surrounds said inner region.

Example 3. The method of Example 1, wherein said sample comprises p-type semiconductor and said first polarity is negative and said second polarity is positive.

Example 4. The method of Example 1, wherein said sample comprises n-type semiconductor and said first polarity is positive and said second polarity is negative.

Example 5. The method of any of the Examples above, wherein said charge is deposited by a corona gun.

Example 6. The method of any of the Examples above, wherein said applying probe radiation comprise directing a laser beam from a probe laser to said inner region on said sample.

Part VIII: Ionizer

Example 1. A system for optically interrogating a sample accompanied by the application of electric charge to said sample, said system comprising:

an optical source configured to emit an incident light beam towards said sample;

a corona discharge source disposed with respect to the sample to provide electric charge to the sample;

an optical detection system configured to detect an output light beam from the sample; and an ionizer configured to produce ions to at least partially neutralize electric charge produced by the corona discharge source.

Example 2. The system of any of the Examples above, wherein said ionizer comprises a source of light.

Example 3. The system of any of the Examples above, wherein said ionizer comprises a source of x-rays.

Example 4. The system of any of the Examples above, wherein said ionizer comprises a source of soft x-rays.

Example 5. The system of any of the Examples above, wherein said corona discharge source comprises a corona gun.

Example 6. The system of any of the Examples above, wherein said output beam comprises a second harmonic generation (SHG) light beam.

Example 7. The system of any of the Examples above, wherein said ionizer is configured to neutralize electric charge proximal to the surface of the sample.

Example 8. The system of any of the Examples above, wherein said ionizer is configured to neutralize electric charge on the surface of the sample.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

What is claimed is:

1. A system for optically interrogating a sample accompanied by application of electric charge to said sample, said system comprising:

an optical source configured to emit an incident light beam towards said sample;

a corona discharge source disposed with respect to the sample to provide said electric charge to the sample; and an optical detection system configured to detect an output light beam from the sample, wherein said corona discharge source comprises a focus ring comprising at least one wall, said focus ring having proximal and distal ends and an opening at the distal end through which said electric charge from said corona discharge source exits toward said sample, said at least one wall having a first window for passage of said incident light beam from said optical source at an oblique angle to said sample via said first window and the opening at the distal end of the focus ring, said first window being separated from said opening at said distal end of said focus ring with said opening at said distal end of said focus ring being more distal than said first window in said at least one wall of said focus ring.

2. The system of claim 1, wherein said at least one wall of said focus ring has a second window for passage of said output light beam from said sample to said optical detection system at an oblique angle with respect to said sample.

3. The system of claim 1, wherein said output light beam comprises a second harmonic generation (SHG) light beam.

4. The system of claim 1, wherein said focus ring has a tubular shape.

5. The system of claim 1, said corona discharge source further comprising a needle for emission of electric charge, said needle surrounded on opposite sides by said focus ring.

6. The system of claim 1, wherein said at least one wall of said focus ring has a tubular shape.

7. The system of claim 1, wherein said first window is disposed with respect to said optical source and said sample such that said incident light beam is incident on said sample at an angle of between 20 and 70 degrees with respect to a normal to said sample.

8. The system of claim 1, wherein said first window is disposed with respect to said optical source and said sample such that said incident light beam is incident on said sample at an angle of between 30 and 60 degrees with respect to a normal to said sample.

9. The system of claim 1, wherein said corona discharge source further comprises a mask closer to said sample than said focus ring.

10. The system of claim 1, wherein said corona discharge source further comprises a mask closer to said sample than said focus ring, said mask attached to said focus ring.

11. The system of claim 1, further comprising a wafer chuck for supporting said sample.

12. The system of claim 1, wherein said system comprises an inline system configured to be included inline of a semiconductor device processing line.

13. The system of claim 1, further comprising a pump light source for providing additional light to said sample.

\* \* \* \* \*